US010177756B2

(12) United States Patent
Lee (10) Patent No.: US 10,177,756 B2
(45) Date of Patent: Jan. 8, 2019

(54) ISOLATED GATE DRIVER AND A POWER DEVICE DRIVING SYSTEM INCLUDING THE SAME

(71) Applicant: HYUNDAI AUTRON CO., LTD., Seongnam-si (KR)

(72) Inventor: Soon Seob Lee, Seoul (KR)

(73) Assignee: HYUNDAI AUTRON CO., LTD., Seongnam-si (KR)

( * ) Notice: Subject to any disclaimer, the term of this patent is extended or adjusted under 35 U.S.C. 154(b) by 0 days.

(21) Appl. No.: 15/659,318

(22) Filed: Jul. 25, 2017

(65) Prior Publication Data

US 2018/0034459 A1 Feb. 1, 2018

(30) Foreign Application Priority Data

Jul. 26, 2016 (KR) .......................... 10-2016-0095011

(51) Int. Cl.
| | |
|---|---|
| *H03K 17/16* | (2006.01) |
| *H03K 17/0812* | (2006.01) |
| *B60L 15/20* | (2006.01) |
| *H03K 17/691* | (2006.01) |
| *H03K 17/06* | (2006.01) |

(52) U.S. Cl.
CPC ........ *H03K 17/08122* (2013.01); *B60L 15/20* (2013.01); *H03K 17/06* (2013.01); *H03K 17/08128* (2013.01); *H03K 17/161* (2013.01); *H03K 17/166* (2013.01); *H03K 17/168* (2013.01); *H03K 17/691* (2013.01)

(58) Field of Classification Search
CPC ........... H03K 17/08122; H03K 17/161; H03K 17/691; B60L 15/20
USPC ......................................................... 327/265
See application file for complete search history.

(56) References Cited

U.S. PATENT DOCUMENTS

| | | | | |
|---|---|---|---|---|
| 7,869,229 B2 * | 1/2011 | Huynh | .............. | H02M 3/33523 340/636.12 |
| 9,825,617 B2 * | 11/2017 | De Geeter | ............... | H03K 5/04 |
| 2017/0288653 A1 * | 10/2017 | Yokoi | ...................... | H03K 5/08 |

* cited by examiner

*Primary Examiner* — Dinh T Le
(74) *Attorney, Agent, or Firm* — Morgan, Lewis & Bockius LLP (57) ABSTRACT

The isolated gate driver according to the present invention comprises a low voltage part including a PWM transmission unit for receiving a PWM signal from a microcontroller unit and outputting a low voltage PWM signal, and a low voltage logic block for receiving a control signal from the microcontroller unit and outputting a low voltage control signal; an insulation part for boosting the low voltage PWM signal and the low voltage control signal into a high voltage PWM signal and a high voltage control signal, respectively; and a high voltage part including a high voltage logic block for outputting a slew rate control signal in accordance with the high voltage control signal, and a slew rate controller for controlling a slew rate of a gate voltage of a power device external to the isolation gate driver such that the gate voltage of the power device has the slew rate depending on the slew rate control signal at a rising edge or a falling edge, wherein the high voltage part is insulated from the low voltage part by the insulation part.

17 Claims, 8 Drawing Sheets

ISOLATED GATE DRIVER AND A POWER DEVICE DRIVING SYSTEM INCLUDING THE SAME

CROSS-REFERENCE TO RELATED APPLICATIONS

This application claims priority to and the benefit of Korean Patent Application No. 10-2016-0095011 filed in the Korean Intellectual Property Office on Jul. 26, 2016, the entire contents of which are incorporated herein by reference.

BACKGROUND OF THE INVENTION

Field of the Invention

The present invention relates to a power device driving system, and more particularly, to a power device driving system including an isolated gate driver and an isolated gate driver for driving a power device for a vehicle.

Background Art

Recently, as the sales of eco-friendly vehicles grow, power devices such as IGBT (Insulated Gate Bipolar Transistor) or SiC (Silicon Carbide) have been increasingly used as switching devices for driving electric vehicles or hybrid vehicle systems that use a lot of high voltage signals like a motor driving or high voltage conversion.

Further, isolated gate drivers also have been increasingly used to drive such power devices. In the isolated gate drivers, the slope of the voltage applied to the gate (slew rate) should be properly adjusted for the safe operation of the power devices. Conventionally, when an isolated gate driver provided power to the gate of power devices, a slew rate of the gate voltage was controlled by external resistors which had fixed resistance values in a circuit design.

Figure 1:
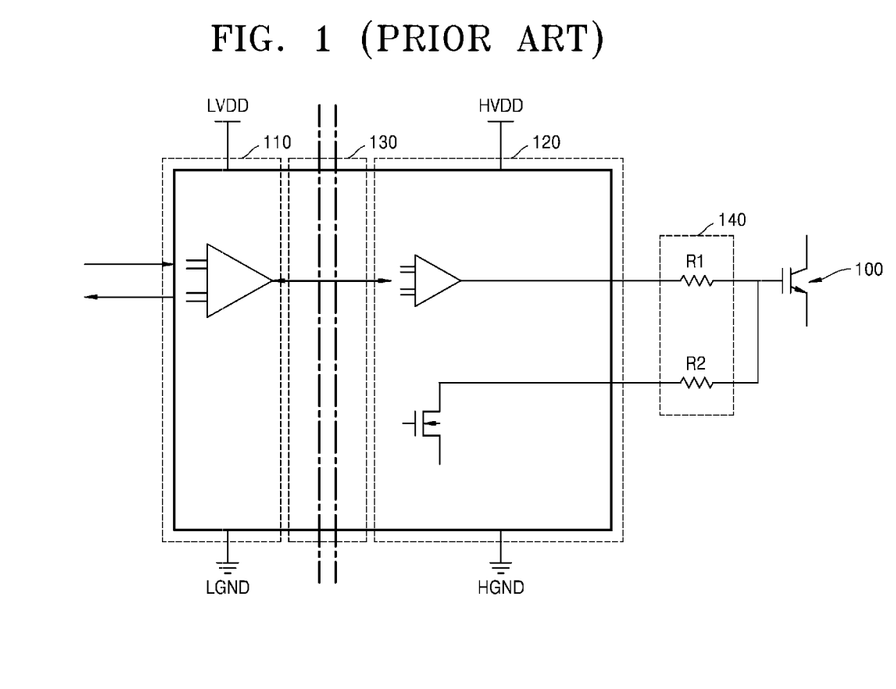
FIG. 1 is a circuit diagram illustrating a power device driving system according to the prior art.

FIG. 1 is a circuit diagram illustrating an isolated gate driver according to the prior art. Referring to FIG. 1, the conventional slew rate controller of an input voltage will be described below. The isolated gate driver of FIG. 1 includes a low voltage part 110 driven by a low voltage power supply LVDD, a high voltage part 120 driven by a high voltage power supply HVDD, an insulation part 130 and an external slew rate control part 140.

As shown in FIG. 1, since the conventional isolated gate driver controlled the slew rate through the external resistors having fixed resistance values, there were a lot of limitations that the slew rates of the gate voltages of the power devices were fixed only to initial design values.

Prior Art Document: Korean Patent Registration No. 10-0212754 (Issued Date: May 12, 1999)

SUMMARY OF THE INVENTION

An object of the present invention is to provide an isolated gate driver which can control slew rates during turn-on and turn-off of the power device for a vehicle based on the PWM signal and the control signal from the microcontroller unit. However, these problems are illustrative, and thus the scope of the present invention is not limited thereto.

An isolated gate driver according to an aspect of the present invention for solving the above problems is provided. The isolated gate driver comprises a low voltage part including a PWM transmission unit for receiving a PWM signal from a microcontroller unit and outputting a low voltage PWM signal, and a low voltage logic block for receiving a control signal from the microcontroller unit and outputting a low voltage control signal; an insulation part for boosting the low voltage PWM signal and the low voltage control signal into a high voltage PWM signal and a high voltage control signal, respectively; and a high voltage part including a high voltage logic block for outputting a slew rate control signal in accordance with the high voltage control signal, and a slew rate controller for controlling a slew rate of a gate voltage of a power device external to the isolation gate driver such that the gate voltage of the power device has the slew rate depending on the slew rate control signal at a rising edge or a falling edge, wherein the high voltage part is insulated from the low voltage part by the insulation part.

In this case, the isolated gate driver may further comprise an adaptive control unit for receiving information on at least one of a voltage value crossing the power device, a current value passing the power device and a temperature of the power device, wherein the adaptive control unit further controls the slew rate controller to change the slew rate of the gate voltage depending on the received information.

Further, the power device may include a plurality of power devices connected parallelly to each other, and the adaptive control unit may receive information on at least one of voltage values crossing each of the plurality of power devices, current values passing each of the plurality of power devices and temperature values of the power device for each of the plurality of power devices.

In addition, the adaptive control unit may receive the temperature values for each of the plurality of power devices and let the slew rate controller control the slew rate of the gate voltage if the highest temperature value is higher than a reference temperature value.

Further, the slew rate controller may comprise a plurality of buffers each having a first switching unit and a second switching unit switched by the slew rate control signal and the high voltage PWM signal.

Further the plurality of buffers may include at least a first buffer and a second buffer, and the current passing through the first switching unit of the first buffer may be different from the current passing through the first switching unit of the second buffer.

Further, the current passing through the first switching unit of the first buffer may be twice the current passing through the first switching unit of the second buffer.

Further, the second switching unit of the first buffer may be controlled to be opened when the first switching unit of the first buffer is closed.

Meanwhile, according to an embodiment of the present invention, a power device driving system comprises a microcontroller unit; a power device; and an isolated gate driver configured to control a slew rate of a gate voltage of the power device, wherein the isolated gate driver comprises a low voltage part including a PWM transmission unit for receiving the PWM signal from the microcontroller unit and outputting a low voltage PWM signal, and a low voltage logic block for receiving a control signal from the microcontroller unit and outputting a low voltage control signal; an insulation part for boosting the low voltage PWM signal and the low voltage control signal into a high voltage PWM signal and a high voltage control signal, respectively; and a high voltage part including a high voltage logic block for outputting a slew rate control signal in accordance with the high voltage control signal, and a slew rate controller for controlling the slew rate of the gate voltage of the power device external to the isolation gate driver such that the gate voltage of the power device has the slew rate depending on the slew rate control signal at a rising edge or a falling edge, wherein the high voltage part is insulated from the low voltage part by the insulation part.

In this case, the power device driving system may further comprise a sensing unit for detecting information on at least one of a voltage value crossing the power device, a current value passing the power device and a temperature of the power device, wherein the isolated gate driver further includes an adaptive control unit for receiving the information from the sensing unit, and wherein the adaptive control unit further controls the slew rate controller to change the slew rate of the gate voltage depending on the received information.

Further, the power device may include a plurality of power devices connected parallelly to each other, and the sensing unit may detect information on at least one of voltage values crossing each of the plurality of power devices, current values passing each of the plurality of power devices and temperature values of the power device for each of the plurality of power devices, and the adaptive control unit receives, from the sensing unit, the information on the at least one of the voltage values crossing each of the plurality of power devices, the current values passing each of the plurality of power devices and the temperature values of the power device for each of the plurality of power devices.

Further, the adaptive control unit may receive the temperature values for each of the plurality of power devices and let the slew rate controller control the slew rate of the gate voltage if the highest temperature value is higher than a reference temperature value.

Further, the slew rate controller may comprise a plurality of buffers each having a first switching unit and a second switching unit switched by the slew rate control signal and the high voltage PWM signal.

Further, the plurality of buffers may include at least a first buffer and a second buffer, and the current passing through the first switching unit of the first buffer may be different from the current passing through the first switching unit of the second buffer.

Further, the current passing through the first switching unit of the first buffer may be twice the current passing through the first switching unit of the second buffer.

Further, the second switching unit of the first buffer may be controlled to be opened when the first switching unit of the first buffer is closed.

Further, the power device driving system may further comprises a pre-driver for outputting a PWM signal to the power device, wherein the isolated gate driver is connected to the pre-driver.

DESCRIPTION OF REFERENCE NUMERALS

210: Low Voltage Part
212: PWM Transmission Unit
214: Low Voltage Logic Block
220: High Voltage part
222: High Voltage Logic Block
224: Slew Rate Controller
310: Switch Controller
320: Buffer
322: First Switching Unit
323: Second Switching Unit
410: Pre-Driver
420: Separate Gate Driver

DETAILED DESCRIPTION OF THE INVENTION

Hereinafter, embodiments of the present invention will be described in detail with reference to the accompanying drawings. It should be understood, however, that the invention is not limited to the disclosed embodiments, but may be embodied in many different forms and should not be construed as being limited to the embodiments set forth herein. Rather, these embodiments are provided so that this disclosure will be thorough and complete, to be fully informed. Also, for purposes of explanation, components may be exaggerated or reduced in size in the drawings.

Hereinafter, preferred embodiments of the present invention will be described in detail with reference to the accompanying drawings. The following embodiments are to be considered as illustrative and not restrictive, and the scope of the present invention is not limited only by the following embodiments.

The present invention has been conceived to improve the control of the slew rate of the power devices, and it is an object of the present invention to provide an isolated gate driver to be able to control the slew rate of an input PWM signal applied to the gate of power devices for a vehicle based on a PWM signal and a control signal from a microcontroller unit.

Figure 2:
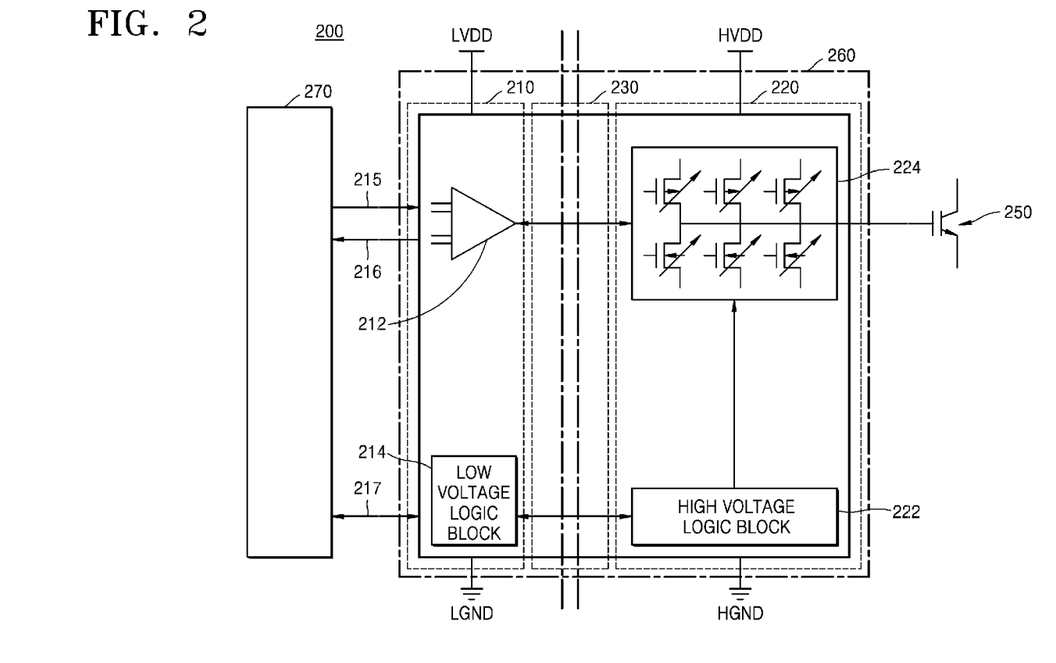
FIG. 2 is a diagram illustrating a power device driving system according to an embodiment of the present invention.

FIG. 2 is a diagram illustrating a power device driving system 200 according to an embodiment of the present invention.

Referring to FIG. 2, a power device driving system 200 according to an embodiment of the present invention includes a power device 250, an isolated gate driver 260, and a microcontroller unit (MCU) 270. The microcontroller unit 270 sends a PWM signal 215 to the isolated gate driver 260 to control the power device 250. A monitoring signal 216 for monitoring various sensing signals is received from the isolated gate driver 260 to the microcontroller unit 270 to check whether the transmitted PWM signal 215 operates the power device 250 properly. The monitoring signal 216 will be described in detail later.

In this case, the isolated gate driver 260 includes a low voltage part 210, a high voltage part 220, and an insulation part 230.

The low voltage part 210 includes a PWM transmission unit 212 for receiving a PWM signal from the microcontroller unit 270 and outputting a low voltage PWM signal having a low voltage, for example, an amplitude of 5V to the insulation part 230. And a low voltage logic block 214 receiving a control signal from the microcontroller unit 270 and outputting a low voltage control signal having a low voltage, for example, an amplitude of 5V to the insulation part 230.

The low voltage part 210 is typically operated by signals having 3V to 5V voltage and the high voltage part 220 is typically operated by signals having 15V to 20V. The low voltage logic block 214 receives control values for the slew rate controller 224 from the microcontroller unit 270 using a communication line 217. For example, the communication line 217 may include a serial peripheral interface (SPI) or an integrated circuit (I2C) and transmit the control values to the high voltage part 220 through the insulation part 230.

The insulation part 230 boosts low voltage PWM signal and the low voltage control signal into a high voltage PWM signals and a high voltage control signals having high voltage signals, while the insulation part 230 insulates the low voltage part 210 and the high voltage part 220. Further, the insulation part 230 provides the high voltage PWM signals and the high voltage control signals to the slew rate controller 224 and the high voltage logic block 222 of the high voltage part 220, respectively.

The high voltage part 220 includes the high voltage logic block 222 for outputting slew rate control signals for controlling the slew rate controller 224 based on the received high voltage control signal and the slew rate controller 224 for converting the high voltage PWM signals into a slew rate-controlled PWM signal depending on the received slew rate control signals. In this case, the slew rate-controlled PWM signal converted by the slew rate controller 224 has a controlled slew rate on the rising edge and/or the falling edge depending on the slew rate control signals. The voltage of high voltage PWM signals typically ranges from 15V to 20V. The low voltage part 210, the high voltage part 220, and the isolation part 230 are preferably implemented as a single chip.

Figure 3:
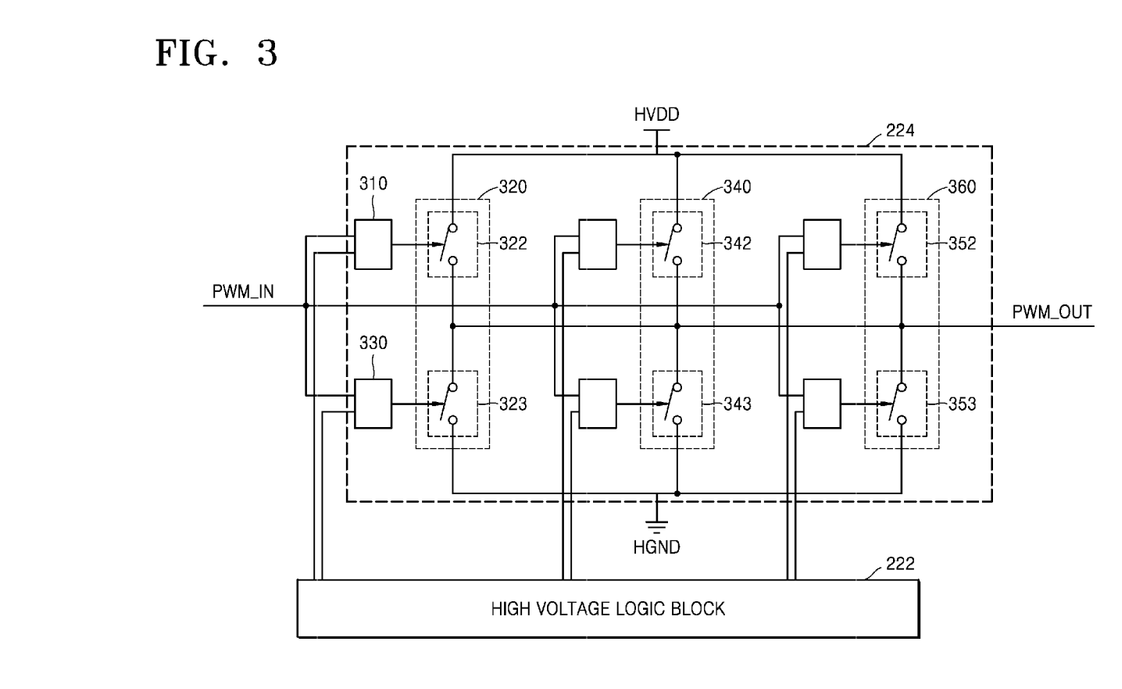
FIG. 3 is a detailed block diagram illustrating a slew rate control unit according to an embodiment of the present invention.

FIG. 3 is a detailed circuit diagram showing an example of the slew rate controller 224.

Referring to FIG. 3, the slew rate controller 224 may include an input portion PWM_IN, an output portion PWM_OUT, a plurality of buffers 320, 340 and 360, and a plurality of switch controllers 310 and 330. In this embodiment, the slew rate controller 224 including three buffers has been described as an example. However, it is possible to modify this embodiment to use the various number of buffers according to how many steps the slew rates are to be adjusted, that is, according to the required slew rate control resolution. For example, in this embodiment, it is possible to adjust the slew rate by eight steps of slopes by using three buffers.

The plurality of switch controllers 310 and 330 receive the slew rate control signals and the high voltage PWM signal from the input portion PWM_IN and the high voltage logic block 222 and can control the plurality of switching units 322 and 323 based on the received PWM signals and the slew rate control signals.

Meanwhile, each buffer includes at least two switching units, a first switching unit 322 and a second switching unit 323.

The first switching unit 322 is connected to the output of the switch controller 310 and can be closed or opened under the control of the switch controller 310. For example, the first switching unit 322 is closed when the high voltage control signal is at the high voltage ("1") and the voltage of the PWM signal is also at the high voltage. Or when either of the control signal and the PWM signal is the low voltage, the first switching unit 322 is opened. In this case, when the first switching unit 322 is closed, it is preferable that the second switching unit 323 is controlled to be opened. When the first switching unit 322 is closed, the power supply voltage HVDD of the high voltage part 220 is applied to the output PWM_OUT of the slew rate controller 224 and supply currents to the gate of the power device 250.

The second switching unit 323 is connected to the output of the switch controller 330 and can be closed or opened under the control of the switching control unit 330. For example, the second switching unit 323 can be closed when the high voltage control signal is at the high voltage ("1") and the voltage of the PWM signal is at the low voltage ("0"). In this case, when the second switching unit 323 is closed, it is preferable to control the first switching unit 322 to be opened. When the second switching unit 323 is closed, the ground HGND of the high voltage part 220 is connected to the output PWM_OUT of the slope control unit 224 and currents get to flow to the ground HGND.

In this case, as the number of the closed switching units among the plurality of switching units 322, 342, and 352 connected to the power source HVDD of the high voltage part 220 increases, the supply of currents from the power source HVDD of the high voltage part 220 also increases and the voltage provided to the gate of the power device 250 rises rapidly at the rising edge of the gate signal (i.e., the slew rate of rising edge becomes larger). Conversely, as the number of the closed switching units among the plurality of switching units 323, 343, and 353 connected to the ground (HGND) of the high voltage part 220 increases, the flow of currents to the ground (HGND) of the high voltage part 220 from the gate of the power device 250 also increases so that the gate voltage is rapidly lowered at the falling edge of the PWM signal (that is, the slew rate at falling edge becomes larger).

Hereinafter, referring to FIGS. 8A to 8C, the switch controller 330 and the switching unit 323, 343 and 353 will be described in detail.

Figure 8A:
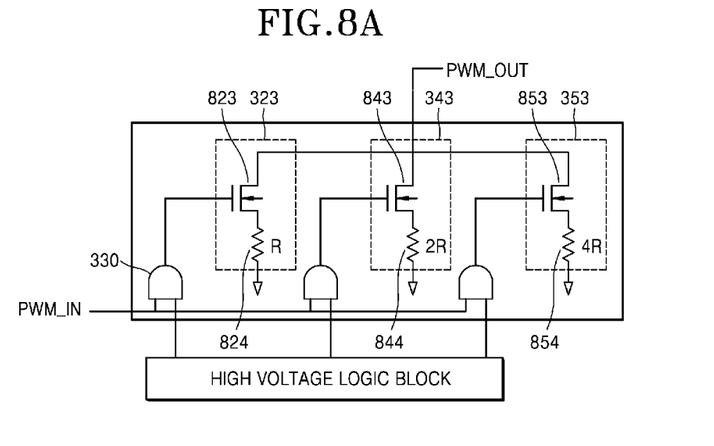
FIG. 8A, FIG. 8B, and FIG. 8C are detailed circuit diagrams illustrating an example of the slew rate controller according to an embodiment of the present invention.

Referring to FIG. 8A, the switching control unit 330 may be implemented by AND gate, and the second switching unit 323 may be implemented by a transistor 823 and a resistor 824. In this case, the resistors 824, 844, and 854 of the switch units 323, 343, and 353 have resistance values different from each other. For example, the resistance values of the resistors 824, 844 and 854 may be doubled to each other. That is, (the resistance value of the resistor 824):(the resistance value of the resistor 844):(the resistance value of the resistor 824)=1:2:4.

In this case, since when each of the transistors 823, 843 and 853 is turned on (i.e., the switch is closed) the ground is connected to each of the resistors 824, 844 and 854 in a same manner, the ratio of the passing current for the respective resistors 824, 844 and 854 becomes 4:2:1. That is, the values of the currents flowing from the gate node of the power device 250 (PWM_OUT) via the respective resistors 824, 844 and 854 to the ground are different from each other. By varying the magnitude of the currents flowing via the respective switching units 323, 343, and 353, it is possible to control the slew rates with various resolution. In this embodiment, the slew rates can be adjusted by 3 bits, that is, 8 levels.

In this embodiment, the switching units are implemented by a MOSFET, but bipolar transistors may also be used. Those skilled in the art will appreciate that it is possible to implement the switches in a variety of ways to apply current from a power source using various type of transistors.

Figure 8B:
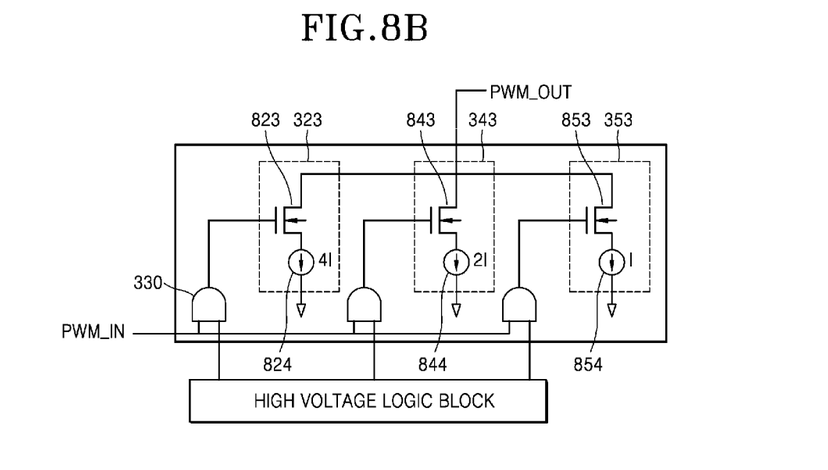

FIG. 8B is almost similar as FIG. 8A, but the resistors are replaced by the current sources 824, 844, and 854 having different sizes.

Figure 8C:
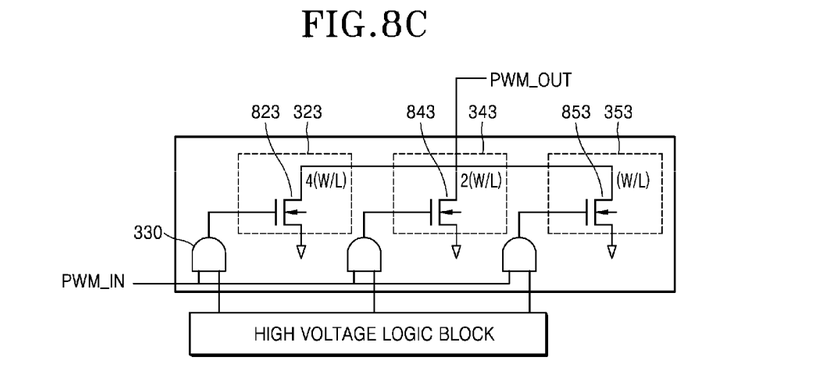

FIG. 8C shows an embodiment of the present invention in which the size (channel length and/or width) of each transistor, which is a switching unit, is different from each other. For example, (size of transistor 824):(size of transistor 844):(size of transistor 854)=4:2:1. That is, the size of the transistor 824 can be configured to be twice the size of the transistor 844. By varying the sizes of the transistors of the buffers 320, 340, and 360, the slew rates can be controlled by various resolutions. In this embodiment, the slew rates can be adjusted in eight steps through control of the 3-bit high voltage logic block. Likewise, the second transistors 323, 343, and 353 can control the slew rate.

FIGS. 8A, 8B and 8C illustrate the embodiment in which the current flowing from the gate of the power device 250 to the ground is adjusted to adjust the falling slope of the falling edge. In contrast, it is also possible to supply current from the power source to the output of the slope control unit 224 in the form similar as the example implementation of FIGS. 8A, 8B and 8C.

In addition, it is also possible to control to perform the function of the active miller clamp using the circuit implemented in FIGS. 8A to 8C.

Hereinafter, the effect of the slew rate control of the PWM signal of the present invention will be described with reference to FIGS. 2, 3, 7A and 7B.

Figure 7A:
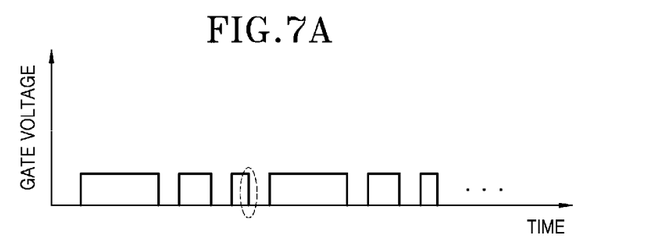
FIG. 7A and FIG. 7B are graphs for explaining the slew rate control according to an embodiment of the present invention.

For explanation, it is assumed that a PWM signal like FIG. 7A is applied to the gate of the power device 250. In this case, FIG. 7B is an enlarged view for the falling edge portion of the PWM signal indicated by the dotted circle in FIG. 7A.

Figure 7B:
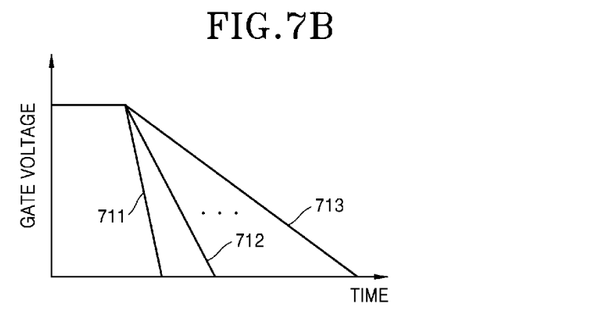

Referring to FIGS. 2, 3, and 7B, when all the second switching units 323, 343, and 353 of the buffers 320, 340, and 360 are closed (See line 711), the gate voltage of the PWM signal falls very rapidly. In the case where only the second switching unit 353 having the smallest current flowing amount among the second switching units 323, 343 and 353 of the buffers 320, 340 and 360 is closed, the gate voltage of the PWM signal falls very slowly (See line 713). That is, when the switches of all passages through which the current can flow are closed, the gate voltage drops quickly, and when the number of switches of the passages through which the current flows are reduced, the gate voltage drops slower. On the rising edge, the same principle can be applied to control the slew rate of the PWM signal of the gate voltage.

Since the gate voltage can fall very rapidly at the falling edge, the function of the active mirror clamp used for the rapid falling can be replaced by the slew rate controller 224 of the present invention.

In addition, the slew rate controller 224 of the present invention can also perform a soft turn-off function that reduces a slope of a gate voltage drop (turn-off) upon occurrence of an overcurrent or a short circuit.

Of course, it is also possible to set an appropriate slope regardless of external conditions or loads.

Hereinafter, another embodiment of the present invention will be described with reference to FIG. 4. The power device driving system 200 according to FIG. 4 further includes a separate gate driver 420.

Figure 4:
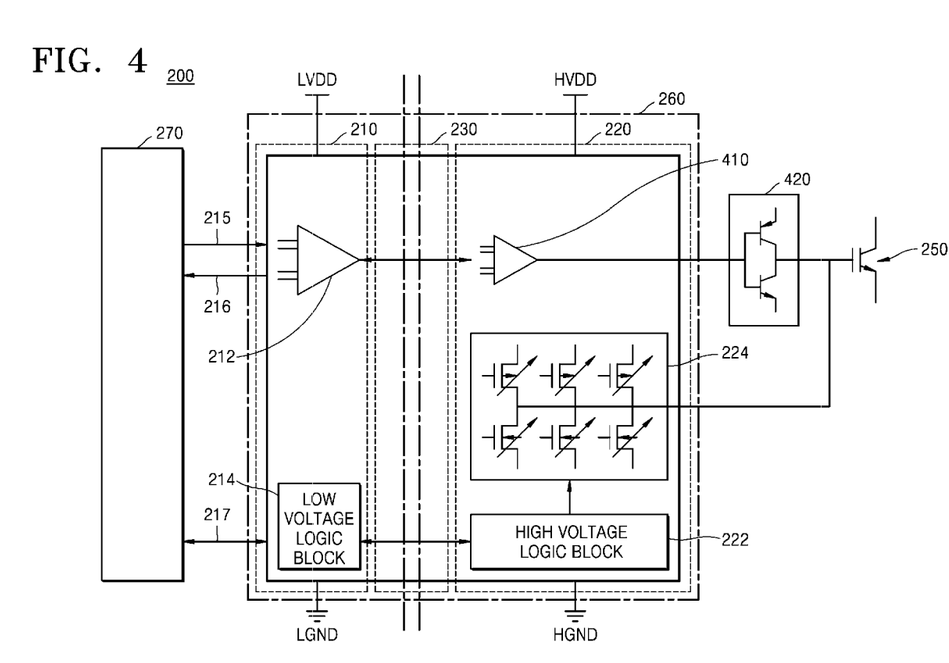
FIG. 4 is a circuit diagram illustrating a power device driving system including an isolated gate driver and a separate gate driver according to an embodiment of the present invention.

Referring to FIG. 4, the isolated gate driver 260 includes a low voltage part 210, a high voltage part 220 and an insulation part 230. In this case, the high voltage part 220 includes a pre-driver 410 for driving a separate gate driver 420. The pre-driver 410 receives the voltage-raised PWM signal through the insulation part 230 from the PWM transmission unit 212.

The separate gate driver 420 outputs the gate driving voltage to the power device 250 by the PWM signal received from the pre-driver 410. The separate gate driver 420 is used when a larger current is required than the PWM signal supplied from the isolated gate driver 260 because a large current should be supplied to drive the power device 250.

Figure 5:
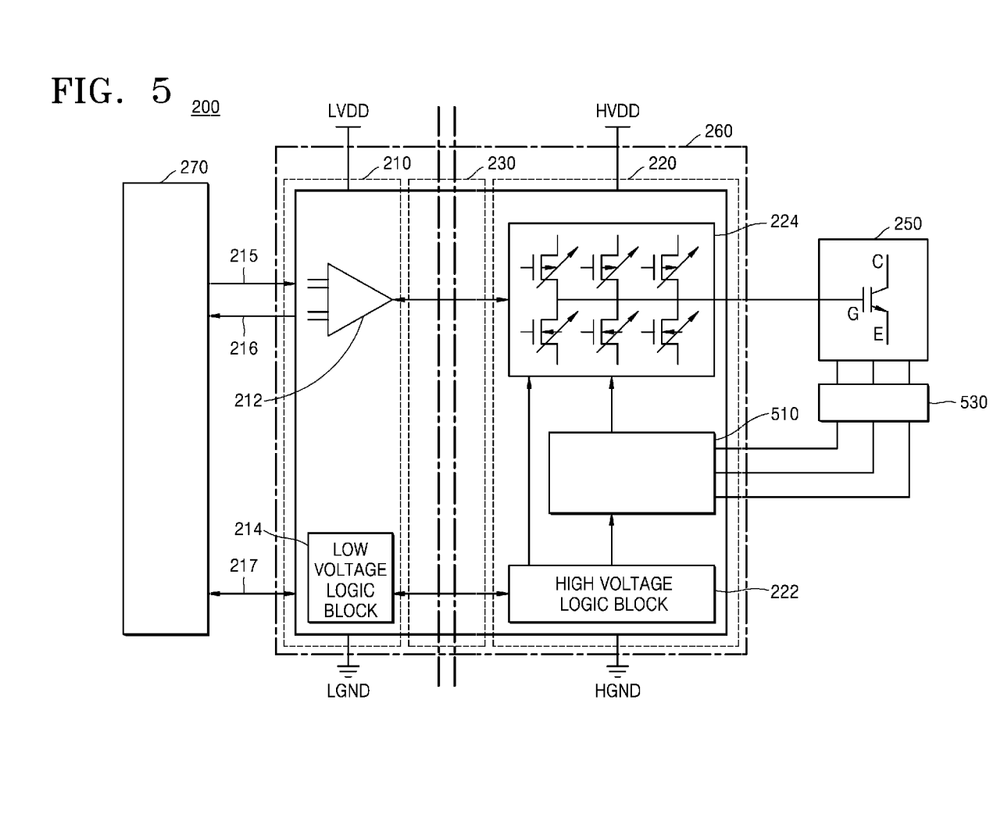
FIG. 5 is a circuit diagram illustrating a power device driving system that senses current, voltage, and/or temperature of a power device according to an embodiment of the present invention and adjusts the rising and falling slopes of the gate voltage of the power device.

FIG. 5 is a circuit diagram showing a power device driving system 200 according to another embodiment of the present invention. The power device driving system 200 according to the embodiment of FIG. 5 further includes a sensor 530 for measuring the current flowing in the power device 250, the temperature of the power device 250 or the voltage across the power device 250.

The high voltage part 220 receives information on at least one of the current, the voltage and the temperature measured by the sensor 530 and lets the adaptive controller 510 control the slew rate controller 224 based on the received information.

In this case, the high voltage logic block 222 may control the slew rate controller 224 through the adaptive controller 510 or may control the slew rate controller 224 based on the control signal 217 received from the microcontroller unit 270 via the low voltage logic block 214. The microcontroller unit 270 can select whether the high voltage logic block 222 controls the slew rate controller 224 through the adaptive control unit 510 or the high voltage logic block 222 directly controls the slew rate controller 224 based on the control value received from the microcontroller unit 270.

That is, the microcontroller unit 270 may control the slew rate controller 224 based on the monitoring signal 216 that has the information on the operation status of the power device 250, such as the current, voltage, and temperature of the power device 250. Or the adaptive control unit 510 adaptively controls the slew rate controller 224 using the information received through the sensor 530.

For example, if the sensor 530 informs to the adaptive control unit 510 that the current of the power device becomes greater than a reference current while the specific voltage rising and/or falling slope indicated by the microcontroller unit 270 is maintained from the initial startup state, the slew rate of the gate voltage of the power device 250 can be controlled lower to avoid current peaking during turn-off-time. Alternatively, the slew rate of the gate voltage of the power device 250 can be adjusted such as increasing the slope when the voltage (VCE) between the collector (C) and the emitter (E) of the power device is low and the temperature is low.

In this case, the slew rate of the gate voltage can be adaptively selected depending on various conditions (overcurrent, short circuit, etc.) of the power device. Therefore, the stability of the power device consuming the most power in a motor vehicle is greatly enhanced, and the efficiency is much improved through the optimized control of the slew rate of the power device. And therefore, the power consumption of the device utilizing the power device can be much improved (For example, the fuel efficiency of the automobile can be much improved).

Figure 6:
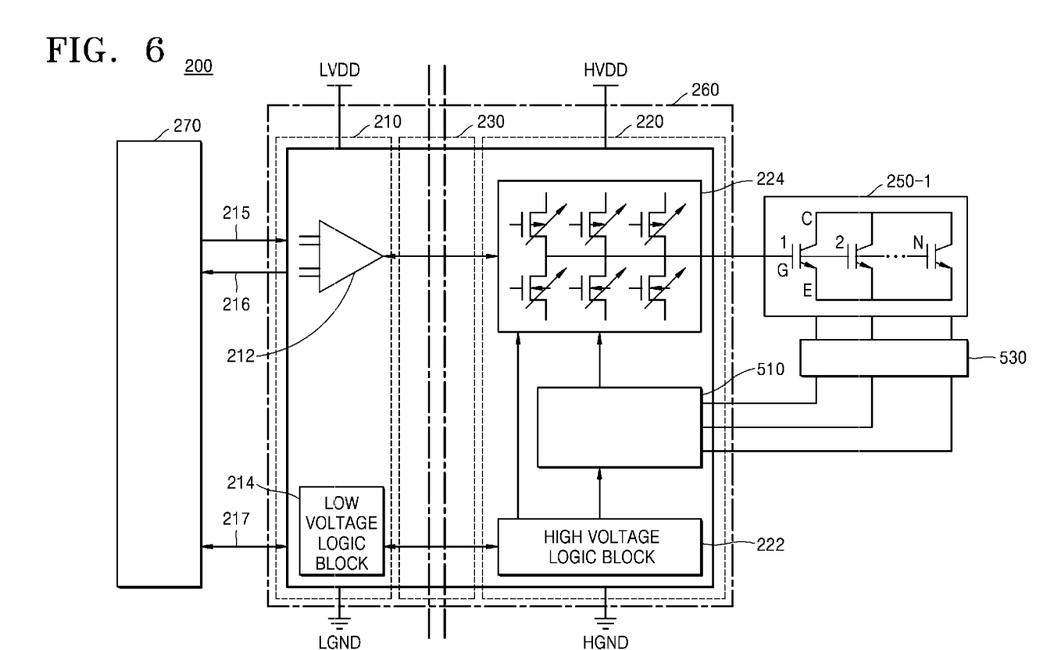
FIG. 6 is a circuit diagram illustrating a power device driving system in which the power device is composed of a plurality of power devices connected in parallel according to according to an embodiment of the present invention.

FIG. 6 is a circuit diagram showing a power device driving system 200 according to an embodiment of the present invention. Basically, FIG. 6 is substantially the same as the embodiment shown in FIG. 5, and only different portions from the embodiment of FIG. 5 will be described for the sake of simplicity.

Referring to FIG. 6, a plurality of power devices 250-1 (N power devices in FIG. 6) may be connected in parallel to supply a sufficient current to drive a motor. In this case, sensors 530 may separately measure at least one of current, voltage, and temperature of each of a plurality of power devices connected in parallel.

For example, the slew rate or the gate voltage of the power devices 250 may be controlled by measuring the maximum temperature among the temperatures of the N parallelly-connected power devices 250-1. Or the slew rate of the gate voltage of the power devices 250-1 may be controlled when the maximum value of the current values or the voltage values of the N parallelly-connected power devices 250 exceeds a reference current or a reference voltage.

Whole of the power devices 250-1 can have a problem when any of the power devices 250 connected in parallel has problem. Therefore, problems and inefficiencies can be solved by measuring and using the respective currents, voltages, and temperatures.

The present invention can automatically control the slew rate of the gate drive voltage for enhancing stability of the power devices and stability of the system when using power devices connected to the outside of the isolated gate driver. Conventionally, a fixed value of the slew rate was used for controlling the slew rates of the external power devices, but according to the present invention, slew rates can be automatically controlled internally and set depending on the operation state.

Therefore, according to the present invention, slew rates during turn-on and turn-off of the power device for a vehicle can be controlled based on the PWM signal and the control signal from the microcontroller unit. In addition, the slew rate control performed by an external device such as a resistor which is conventionally connected to the outside of the power device can be performed depending on various conditions inside of the isolated gate driver, so that the cost can be reduced by incorporating external devices. And the slew rates of the gate voltage of the power device can be automatically selected optimally, and, in addition, the active mirror clamp function can be incorporated. Therefore, the stability of a power device consuming a lot of power can be greatly improved, and the efficiency can be improved by optimized control, which can improve the fuel efficiency of the vehicle.

While the present invention has been described in connection with what is presently considered to be practical exemplary embodiments, it is to be understood that the invention is not limited to the disclosed embodiments, but, on the contrary it is to be understood that the invention is not limited to the disclosed embodiments and intended to cover various modifications and similarities. Accordingly, the scope of the present invention should not be construed as being limited to the embodiments described, and it is to be interpreted that the scope of the present invention covers not only the claims of the following patent claims but also equivalents thereof.

What is claimed is:

1. An isolated gate driver comprising:
   a low voltage part including a PWM transmission unit for receiving a PWM signal from a microcontroller unit and outputting a low voltage PWM signal, and a low voltage logic block for receiving a control signal from the microcontroller unit and outputting a low voltage control signal;
   an insulation part for boosting the low voltage PWM signal and the low voltage control signal into a high voltage PWM signal and a high voltage control signal, respectively; and
   a high voltage part including a high voltage logic block for outputting a slew rate control signal in accordance with the high voltage control signal, and a slew rate controller for controlling a slew rate of a gate voltage of a power device which is external to the isolation gate driver and electrically connected to the slew rate controller of the high voltage part such that the gate voltage of the power device has the slew rate depending on the slew rate control signal at a rising edge or a falling edge,
   wherein the isolation part disconnects a direct electric connection between the low voltage part and the high voltage part.

2. The isolated gate driver of claim 1, further comprising an adaptive control unit connected to the power device and receiving information on at least one of a voltage value applied to the power device, a current value passing the power device and a temperature of the power device,
   wherein the adaptive control unit controls the slew rate controller to change the slew rate of the gate voltage depending on the received information of the adaptive control unit.

3. The isolated gate driver of claim 1, further comprising an adaptive control unit,
   wherein the power device includes a plurality of power devices connected in parallel to each other, and
   wherein the adaptive control unit connected to the power device receives information on at least one of voltage values applied to each of the plurality of power devices, current values passing each of the plurality of power devices and temperature values of the power device for each of the plurality of power devices, and
   wherein the adaptive control unit controls the slew rate controller to change the slew rate of the gate voltage depending on the received information.

4. The isolated gate driver of claim 3, wherein the adaptive control unit receives the temperature values for each of the plurality of power devices and lets the slew rate controller control the slew rate of the gate voltage if a highest temperature value is higher than a reference temperature value.

5. The isolated gate driver of claim 1, wherein the slew rate controller comprising a plurality of buffers each having a first switching unit and a second switching unit switched by the slew rate control signal and the high voltage PWM signal.

6. The isolated gate driver of claim 5, wherein the plurality of buffers includes at least a first buffer and a second buffer, and
   wherein a current passing through the first switching unit of the first buffer is different from a current passing through the first switching unit of the second buffer.

7. The isolated gate driver of claim 6, wherein the current passing through the first switching unit of the first buffer is twice the current passing through the first switching unit of the second buffer.

8. The isolated gate driver of claim 6, wherein the second switching unit of the first buffer is controlled to be opened when the first switching unit of the first buffer is closed.

9. A power device driving system comprises:
a microcontroller unit;
a power device; and
an isolated gate driver configured to control a slew rate of a gate voltage of the power device,
wherein the isolated gate driver comprising:
a low voltage part including a PWM transmission unit for receiving a PWM signal from the microcontroller unit and outputting a low voltage PWM signal, and a low voltage logic block for receiving a control signal from the microcontroller unit and outputting a low voltage control signal;
an insulation part for boosting the low voltage PWM signal and the low voltage control signal into a high voltage PWM signal and a high voltage control signal, respectively; and
a high voltage part including a high voltage logic block for outputting a slew rate control signal in accordance with the high voltage control signal, and a slew rate controller for controlling the slew rate of the gate voltage of the power device which is external to the isolation gate driver and is electrically connected to the slew rate controller of the high voltage part, such that the gate voltage of the power device has the slew rate depending on the slew rate control signal at a rising edge or a falling edge,
wherein the isolation part disconnects a direct electric connection between the low voltage part and the high voltage part.

10. The power device driving system of claim 9, further comprising a sensing unit for detecting information on at least one of a voltage value applied to the power device, a current value passing the power device and a temperature of the power device,
wherein the isolated gate driver further includes an adaptive control unit connected to the power device and receiving the information from the sensing unit, and
wherein the adaptive control unit controls the slew rate controller to change the slew rate of the gate voltage depending on the received information.

11. The power device driving system of claim 10, wherein the power device includes a plurality of power devices connected in parallel to each other, and
wherein the sensing unit detects the information on at least one of voltage values applied to each of the plurality of power devices, current values passing each of the plurality of power devices and temperature values of the power device for each of the plurality of power devices, and
wherein the adaptive control unit receives, from the sensing unit, the information on the at least one of the voltage values applied to each of the plurality of power devices, the current values passing each of the plurality of power devices and the temperature values of the power device for each of the plurality of power devices.

12. The power device driving system of claim 11, wherein the adaptive control unit receives the temperature values for each of the plurality of power devices and lets the slew rate controller control the slew rate of the gate voltage if a highest temperature value is higher than a reference temperature value.

13. The power device driving system of claim 9, wherein the slew rate controller comprising a plurality of buffers each having a first switching unit and a second switching unit switched by the slew rate control signal and the high voltage PWM signal.

14. The power device driving system of claim 13, wherein the plurality of buffers includes at least a first buffer and a second buffer, and
wherein a current passing through the first switching unit of the first buffer is different from a current passing through the first switching unit of the second buffer.

15. The power device driving system of claim 14, wherein the current passing through the first switching unit of the first buffer is twice the current passing through the first switching unit of the second buffer.

16. The power device driving system of claim 14, wherein the second switching unit of the first buffer is controlled to be opened when the first switching unit of the first buffer is closed.

17. The power device driving system of claim 9, further comprising a pre-driver for outputting a PWM signal to the power device,
wherein the isolated gate driver is connected to the pre-driver.

* * * * *